(12) United States Patent
Boardman et al.

(10) Patent No.: US 7,626,135 B2
(45) Date of Patent: Dec. 1, 2009

(54) ELECTRODE SYSTEMS AND METHODS OF USING ELECTRODES

(75) Inventors: William John Boardman, Colorado Springs, CO (US); Andrew William Tudhope, Danville, CA (US); Raul Donate Mercado, Danville, CA (US); Thomas Bryan Casserly, Dublin, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 325 days.

(21) Appl. No.: 11/431,358

(22) Filed: May 10, 2006

(65) Prior Publication Data

US 2007/0262059 A1 Nov. 15, 2007

(51) Int. Cl.
*B23K 10/00* (2006.01)
(52) U.S. Cl. .............. 219/121.48; 219/121.51; 219/121.52; 118/723 R
(58) Field of Classification Search ............ 219/121.48, 219/121.51, 121.52, 121.59, 75, 121.4, 121.41, 219/121.43; 118/723 I, 723 R, 723 MW
See application file for complete search history.

(56) References Cited

U.S. PATENT DOCUMENTS

| | | | |
|---|---|---|---|
| 2,690,515 A | 9/1954 | Mack | 313/63 |
| 4,038,171 A | 7/1977 | Moss et al. | 204/298 |
| 5,178,739 A * | 1/1993 | Barnes et al. | 204/192.12 |
| 5,224,441 A | 7/1993 | Felts et al. | 118/718 |
| 5,683,558 A | 11/1997 | Sieck et al. | 204/192.12 |
| 5,721,021 A | 2/1998 | Tobe et al. | 427/570 |
| 5,855,685 A | 1/1999 | Tobe et al. | 118/723 |
| 6,110,540 A | 8/2000 | Countrywood et al. | 427/569 |
| 6,315,872 B1 * | 11/2001 | Pavate et al. | 204/192.15 |
| 6,444,099 B1 | 9/2002 | Sasaki et al. | 204/192.12 |
| 6,495,000 B1 | 12/2002 | Atkinson et al. | 204/192.12 |
| 6,767,436 B2 | 7/2004 | Wei | 204/192 |
| 6,975,073 B2 | 12/2005 | Wakalopulos | 315/111.81 |
| 2003/0008500 A1 | 1/2003 | Nguyen et al. | 438/643 |
| 2005/0164028 A1 | 7/2005 | Reich-Sprenger | 428/660 |

FOREIGN PATENT DOCUMENTS

| | | |
|---|---|---|
| EP | 0 270 144 | 6/1988 |
| EP | 0 801 414 A2 | 4/1997 |
| JP | 55110782 | 8/1980 |
| JP | 4236781 | 8/1992 |
| JP | 7330488 | 12/1995 |
| JP | 2004/43789 | 2/2004 |
| WO | WO 2004/079040 A1 | 9/2004 |
| WO | WO 2006/019565 | 2/2006 |

* cited by examiner

*Primary Examiner*—Mark H Paschall
(74) *Attorney, Agent, or Firm*—Schneck & Schneck; Terry McHugh (57) ABSTRACT

An electrode assembly comprises a coil of electrode material surrounded by a shield having one or more outlets and a supply of shielding gas directed along an axis X-X of said coil before exiting from said shield.

26 Claims, 4 Drawing Sheets

ELECTRODE SYSTEMS AND METHODS OF USING ELECTRODES

TECHNICAL FIELD

The present invention relates to deposition and material modification processes and system for use therewith and relates particularly but not exclusively to plasma enhanced chemical vapor deposition or material modification processes, electrodes used in such systems and methods of using such electrodes.

BACKGROUND ART

"Plasma enhanced chemical vapor deposition" (or PECVD) is a known technique used to form films on various substrates. For example, Felts et al. U.S. Pat. No. 5,224,441 describes an apparatus for rapid plasma deposition. In the plasma enhanced chemical vapor deposition of silicon oxide, a gas stream including components such as a volatilized organosilicon compound, oxygen, and an inert gas such as helium or argon, is sent into an enclosed chamber at reduced pressure and a glow discharge plasma is established from the gas stream or its components. A silicon oxide layer is deposited upon the substrate when it is positioned near the plasma. In such a system, the pressure is typically reduced from atmospheric pressure by a vacuum pumping system. Electrode surfaces are in electrical communication with the gases introduced into the system such that an electrical discharge or plasma is formed. The purpose of this discharge is to excite moieties in the system and cause them to be deposited onto the workpiece or substrate to be coated.

The use of the "hollow cathode effect" is known from the applicant's own patent application WO2006/019565 (Boardman et al.), in which the internal surface of tubes and pipes are modified by a treatment process in which the workpiece itself forms the deposition chamber. Treatment is effected within the workpiece by applying a biasing voltage between an electrode within the workpiece, or just at the exterior of the workpiece, and the workpiece itself whilst passing a treatment gas through the workpiece and maintaining the interior of the workpiece at a reduced pressure. The treatment gas contains the desired element to be deposited or implanted and the pressure is low enough to establish and maintain the "hollow cathode effect" in which the electron mean free path is slightly less than the diameter of the workpiece, thus causing electron oscillation and implantation or deposition of the desired element below or onto the surface of the component itself.

One problem in such systems is that the electrodes can become contaminated with an insulating layer of the material intended for the component. The growth of deposits on the electrodes will result in a shift of the voltage/current characteristics of the system over time and the required operating voltage will increase for a given current as contamination of the electrode progresses. These changes cause a drift in the quality of the dielectric coating produced on the substrate, and require periodic cleaning or replacement of the electrodes.

Furthermore, due to the high impedance presented to the plasma by a contaminated electrode, power will be wasted and excess heat generated. It is desirable to have a process free of drift with a minimum of waste heat generated. A similar problem occurs when the counter electrode must be placed at the exterior of the workpiece electrode. Many times this must be done when the diameter of the tube being coated is small, or if pre-activation of the plasma is needed to provide a uniform coating down the tube. In this case there is a resistance between the high density, hollow cathode plasma in the workpiece (usually biased as the cathode, as described later) and the counter electrode (usually biased as the anode), due to the decay of the plasma as it flows from the cathode to the anode. This problem will of course only become worse if the anode becomes coated with resistive material.

A further problem resides in the fact that one must heat the electrode to thermionic emission temperatures in order to release electrons, and in some arrangements the electrode is so hot that one needs to employ a separate and expensive water cooling apparatus simply to prevent the heat from the electrode adversely affecting the surrounding structure. An example of such an arrangement is shown in Countrywood et al. U.S. Pat. No. 6,110,540, which discusses a counter electrode employed in a deposition process. In FIGS. 3 and 4, for example, a substantial electrode is surrounded by a cooling system which cools the material surrounding the electrode. This patent also discloses the possible use of a coil of refractory metal wire as a substitute for the electrode of FIG. 4 but makes no further comment in connection therewith.

Countrywood et al. requires the addition of a separate magnetic field generating system in order to constrain the generated plasma within the desired region of the anode structure. Such systems introduce additional cost and complexity to an otherwise already complex system and consume additional electrical energy.

Countrywood et al. also requires an AC signal such that the counter electrode alternately acts as an anode and then a cathode. In the hollow tube electrode configurations described in Countrywood et al., a negative (cathode) bias on the counter electrode is required for a portion of the waveform, to generate the intense low impedance plasma (essentially, a hollow cathode plasma). Countrywood et al. does describe a DC anode, but this requires a separate direct current power supply to power the anode. An advantage of the present invention is that a positive bias on the counter electrode is not required, nor is a separate power supply required for DC or DC pulse processes, as in Countrywood et al.

The above-mentioned patent also discloses the use of a gas purge system in which the electrode is protected from the treatment gas by a shielding gas which is passed over the electrode and passes out of a chamber in which the electrode is located via a small hole provided therein. The shielding gas is provided at a higher pressure than the treatment gas, and thus acts to prevent any treatment gas entering the electrode chamber and being deposited thereon. The gas supply associated with the electrode can maintain the gas pressure around the electrode greater than in other areas of the evacuated chamber. These gases form a relatively high-density plasma associated with the electrode, which acts as an extension of the metallic electrode surface and lowers the impedance of the electrode. This electrode system is commonly known as a gas purged electrode. The benefit of using a gas purged electrode is that it provides a constant, low impedance electrical contact with the process plasma. Since the impedance is constant, the process does not drift; since impedance is low, the whole process operates at a lower voltage and less power is wasted. The greater gas pressures around the gas purged electrode are continually replenished by the gas supply, and the gas pressure differential between the area around the gas purged electrode and other areas of the evacuated chamber prevents reactive gases or other components from the main gas supply from approaching the gas purged counter electrode. The gas employed is generally an inert gas, such as helium, neon, or argon, or a mixture such as helium/neon or neon/argon. In reactive sputtering processes it can be oxygen, nitrogen or other reactive gases. Each of these gases may be used in the apparatus and method of the present invention.

SUMMARY OF THE INVENTION

The present invention provides a gas purged electrode arrangement in which the electrode material is provided in the form of a metal coil having a longitudinal axis and the gas outlet is positioned for supplying plasma creating gas substantially along the longitudinal axis of said coil. It will be appreciated that the electrode may form an anode or a cathode. The coil creates a magnetic confinement field which assists with the confinement and intensification of the plasma field whilst electrons, including thermionically emitted electrons, and those flowing from the electrode material, are more readily confined within the field and acquire a high energy level before being released therefrom. In a particularly advantageous arrangement, the electrode material may be surrounded by a shield which effectively acts to encase the electrode material and further shield the electrode material from the main treatment gas within which the electrode material may be operated. The wall of the shield is provided with one or more outlets through which, in operation, the shielding gas passes into the treatment chamber. It has also been found that forming the electrode material into an arc or, preferably, a complete circular form helps intensify the energy of emitted electrons and, in some cases, can lead to a significant increase in the intensity of the plasma. In the case of an electrode material that is remote from the cathode, this arc geometry will provide full plasma activation of the entire diameter of gas volume as it flows between the cathode and electrode material, thus providing lower resistance than a straight electrode material. In each of the arrangements, it has been found that one can enhance the uniformity of emission by varying the number of outlets as the distance from the gas supply increases such that the number, or indeed size thereof, increases the further away the outlets are from the gas inlet. It has been found that an enhanced plasma effect can be created by angling the outlets around the circular electrode material arrangement such that the plasma emitted therefrom converges in a cone-like manner. Other forms of outlets, such as single outlets at the extremity of the shield or a plurality of outlets provided either along the shield or indeed circumferentially around the shield, may be employed and such arrangements are discussed in detail later herein. The electrode material is preferably made of a refractory material such as tantalum, tungsten or molybdenum as such materials are able to operate at elevated temperatures and, thereby, assist with the generation of enhanced numbers of thermionically emitted electrons.

In one preferred arrangement, the electrode comprises an electrode material formed as a coil having a longitudinal axis and a gas inlet for directing a shielding gas generally along the axis whilst being confined by a shield arrangement surrounding the electrode material. The shield is provided with an outlet in a surface thereof so as to allow for the passage of plasma gas out of said shield. Such an arrangement provides both enhanced electron generation and shielding of the electrode material from the potentially harmful coating atmosphere outside of said electrode arrangement.

In an alternative arrangement, the electrode comprises an electrode material formed as a circular coil having a longitudinal axis and a gas inlet for directing a shielding gas generally along the axis whilst being confined by a shield arrangement surrounding the electrode material. The shield is provided with an outlet in a surface thereof so as to allow for the passage of plasma gas out of said shield whilst the circular arrangement assists with the confinement of any generated electrons. Such an arrangement also provides enhanced electron generation and shielding of the electrode material from the potentially harmful coating atmosphere outside of said electrode arrangement. The shield may be formed from any one of a number of suitable materials, but preferably comprises a non-metallic material such as quartz, which may be of a transparent form. The use of a non-metallic material significantly reduces the accumulation of any deposition coating on the outer surface thereof whilst the use of a transparent material allows for the observance of the plasma generation, which can be a significant advantage when first establishing the hollow cathode effect. The shield conveniently includes a portion which fits over a base portion of the electrode and includes a seal therebetween so as to ensure the shielding gas is maintained within the desired region. The electrical connection from the electrode material to an electrical supply is preferably achieved via an insulated connector which insulates the electrode from the base portion through which it must pass in order to connect to the source of electrical power. Also positioned within the base portion is a gas inlet for receiving shielding gas into an optional plenum chamber which acts to distribute the supplied gas to a single or multiplicity of gas inlet(s) associated with the electrode material. In order to ensure the creation of a good quantity of thermionic emissions, one may employ a filament comprising an open coil of tungsten or any other refractory metal such as tantalum or molybdenum. When a tungsten filament is employed, a preferred diameter is 0.2 mm. The electrode material is, preferably, connected to a source of pulsed current which, in operation, causes the electrode material to first heat up and produce thermionically emitted electrons and then cool down to prevent overheating before once again being allowed to heat up and produce further thermionic emissions. The thickness and length of the wire will control the resistance as in $R=\rho L/A$, where $\rho$=specific resistivity, L=length, A=cross sectional area. The wire heating is proportional to the resistance, and thermionic electron emission is proportional to heating.

According to a further aspect of the present invention, there is provided a method of generating a plasma field having the steps of providing an electrode material in the form of a filament coil having a longitudinal axis together with a plasma generating gas which is directed substantially along said axis and over said electrode material. The electrode material is connected to ground and the component 10 (FIG. 1) is connected to a positive source of electrical potential such as to create a plasma surrounding said electrode material. One may also shield the electrode material by providing a shield surrounding said electrode material and passing said plasma generating gas between said shield and said electrode material. When desirable, one may provide the shield in the form of a tube having a sidewall and a plurality of outlets provided within said sidewall for the passage of plasma gas out of said shield.

A particularly advantageous method includes the further steps of shielding said electrode material by providing a shield surrounding said electrode material in the form of a tube having a sidewall, providing a plurality of outlets within said sidewall and passing said plasma generating gas between said shield and said filament and out of said outlets within said shield. Preferably, the method includes the steps of providing said electrode material as a ring of coiled filament, shielding said electrode material by providing a shield surrounding said electrode material in the form of a circular tube having a sidewall and a plurality of outlets provided within said sidewall, and passing said plasma generating gas between said shield and said filament and out of said outlets within said shield. The method may also include the step of directing the exiting plasma gas from the outlets such that any streams of gas are generally convergent and preferably convergent in a manner that forms a cone or ring of plasma gas adjacent to the electrode. When the gas is emitted in accordance with the above method, one may further enhance the coating or treatment process by passing any treatment gas through the a center of said circular tube and into a ring or cone of emitted plasma gas.

The gas purged counter electrodes can be used in plasma enhanced chemical vapor deposition systems using pulsed DC power or AC power supplies. These electrodes use the purge gas to produce an intense plasma jet which is emitted into the evacuated process chamber which may be formed, at least in part, by the component to be treated. The jet, being of relatively high-density plasma, is very conductive and acts as the counter electrode for the process plasma. The process plasma is sustained by an electrical current, supplied between the gas purged counter electrode and the other electrode. The other electrode can be a second gas purged electrode, or may take another form such as a simple metallic rod or plate or may be the component itself. This latter arrangement is of particular advantage when one is coating or treating the internal surface of a small diameter pipe or treating a component in the field. Electrons or ions are easily drawn from the plasma associated with the gas purged counter electrode, as required by the process plasma; hence, the net impedance of the plasma-based electrode is low.

Producing a stable plasma is necessary for the production of consistent quality dielectric coatings. Even for plasma deposition systems using alternating current power, any growth of dielectric deposits on the electrodes will result in a shift of the voltage/current characteristics of the system over time. The required operating voltage will increase, and thus the current will decrease for a given level of power. These changes cause a drift in the properties of the dielectric coating that the method produces, and require the periodic cleaning of the electrodes. The present invention aims to reduce and possibly eliminate this effect whilst enhancing the plasma intensity and the ease of generating the plasma itself.

BRIEF DESCRIPTION OF THE DRAWINGS

The above and other features and aspects of the present invention will become more apparent upon reading the following detailed description in conjunction with the accompanying drawings, in which.

DETAILED DESCRIPTION

Figure 1:
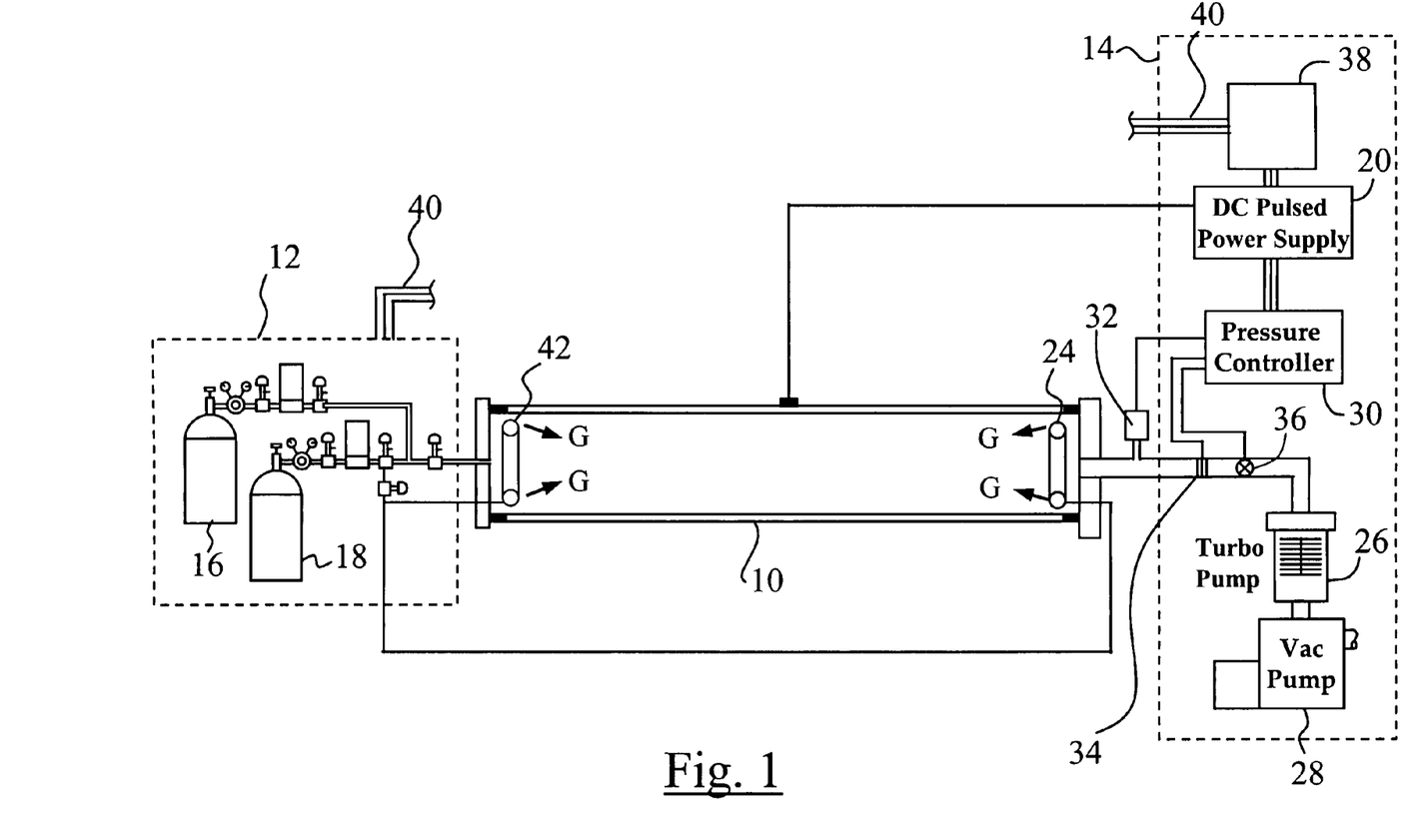
FIG. 1 is a diagrammatic representation of a treatment apparatus incorporating the present invention.

With reference to FIG. 1, a conductive piping, or "workpiece," 10 is shown as being connected to a system that includes a gas supply subsystem 12 and a process control subsystem 14. The workpiece is shown as a single piece, but may be an assembly of tubes or pipes. A readily available treatment gas, such as methane or acetylene, is provided in a first gas supply container 16. This gas is used in implantation or coating steps described later herein. Argon or any other suitable inert gas fit for the purpose is provided from a second gas supply container 18 to allow plasma "pre-cleaning" of the pipe surface and mixing of Argon (Ar) and treatment gas.

A DC pulsed power supply 20 is used to apply a negative bias to the workpiece 10. This bias is used to (a) create a plasma between a cathode and a grounded electrode material, (b) draw an ionized reactive gas to the surfaces to be treated, (c) allow ion bombardment of the film to improve film properties such as density and stress levels, and (d) allow control of film uniformity by adjusting duty cycle so as to permit replenishment of the source gas during the "off" portion of the cycle. Here, the workpiece functions as the cathode and there are grounded anodes 22 and 24 at the opposite ends of the workpiece. A turbo pump 26 and a vacuum pump 28 draw gas from the interior of the workpiece 10 through the exit end. A pressure controller 30 receives information from an optical probe 32 and a langmuir probe 34, which is placed such that the optical probe has a line-of-sight into the plasma and the langmuir probe contacts the plasma. The two probes sense plasma intensity and generate information indicative of the intensity level. This information is used by the controller to determine a proper setting for an adjustable flow member 36, which may be a valve. The setting should be such that the pressure inside the workpiece 10 establishes a condition in which the electron mean free path is slightly less than the inner diameter of the workpiece, causing electron oscillation and increased ionizing collisions by the "hollow cathode" effect. Thus, a more intense plasma is generated within the workpiece. Since the electron mean free path increases as the pressure decreases, it is necessary to decrease pressure as the pipe diameter increases. For example, a quarter inch (6.35 millimeter) diameter gasline will generate a hollow cathode plasma at a pressure of approximately 200 mTorr, while a four inch (101.6 millimeter) diameter pump exhaust duct would generate a plasma at a pressure of approximately 12 mTorr. These are intended to be approximate values to show the general trend of lower pressure with a larger diameter, but the pressure range can vary significantly from these values and still maintain a hollow cathode plasma.

The degree of ionization or plasma intensity is important for the plasma immersion ion implantation and deposition (PIIID) technique to be effective, since it is only the ionized gas that is accelerated across the plasma sheath into the workpiece. The hollow cathode effect provides a more intense plasma than is otherwise available in DC or RF plasmas. This increase in intensity is available without the complications of other means of generating intense plasmas, such as magnets or microwave plasma sources which would be very difficult to implement for internal surfaces, particularly for "in the field" applications. The process also eliminates the need for separate heating of the workpiece 10, as heating is generated by ion bombardment. The optical and langmuir probes are located at the anode end connections to monitor when the intense hollow cathode is properly generated. Computer software control 38 is shown as being connected to the DC pulsed power supply 20 and the pressure controller 30. In addition, the computer software control is able to generate and transmit control signals via an interface cable 40 to the gas supply subsystem 12 for the purpose of governing operations.

Figure 2:
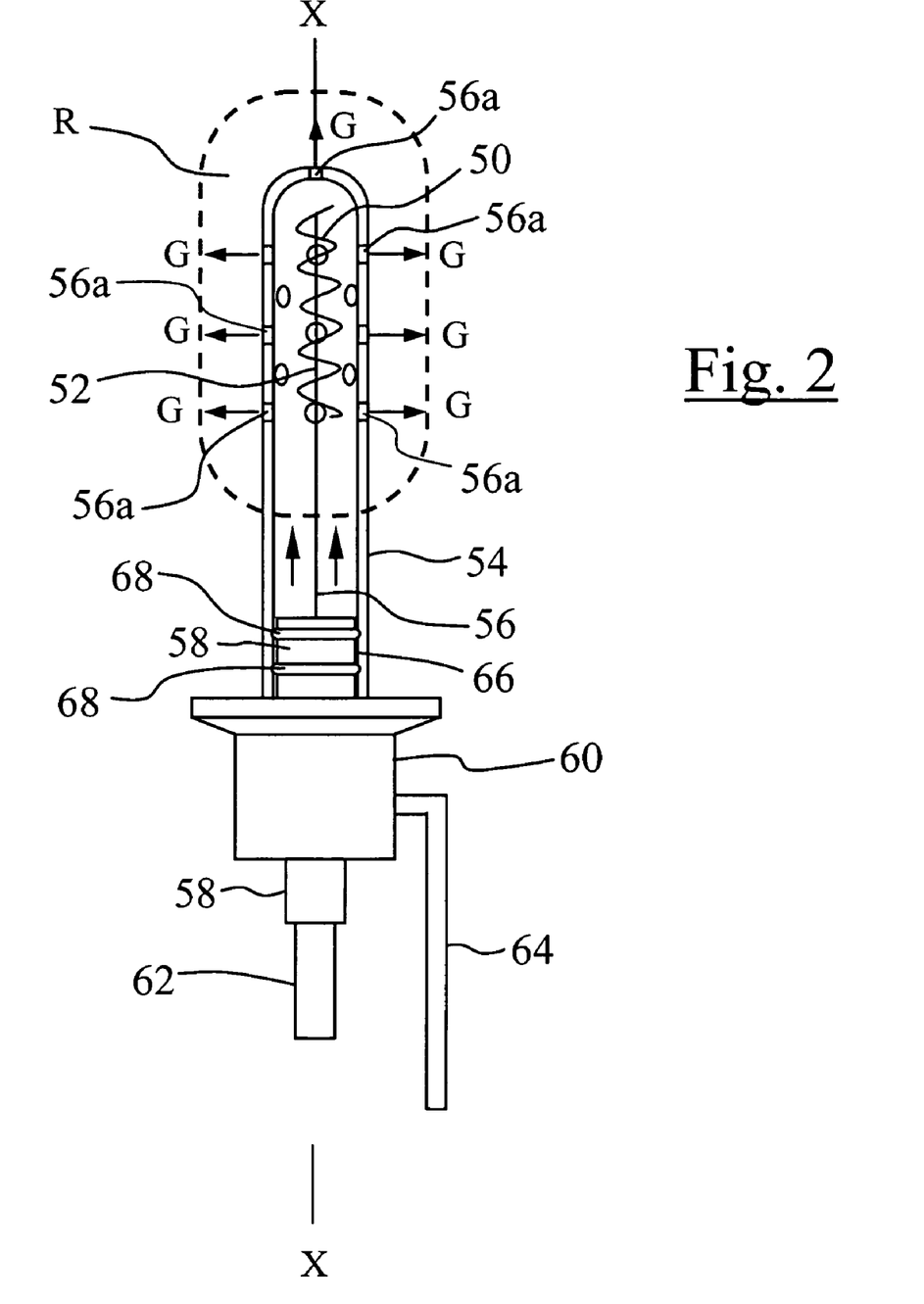
FIG. 2 is a cross-sectional view of a first electrode arrangement according to one aspect of the present invention.
Figure 3:
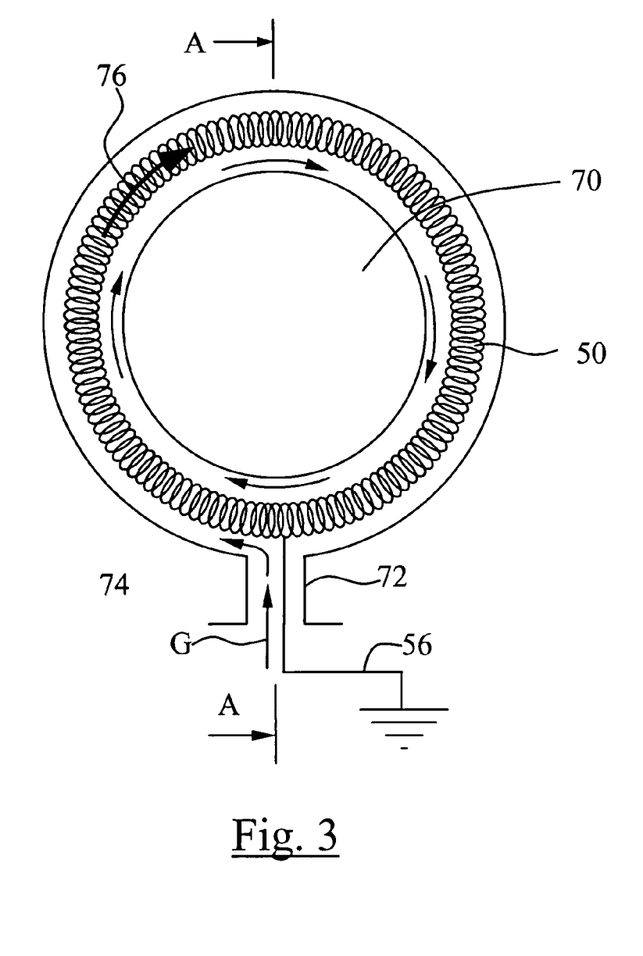
FIG. 3 is a cross-sectional view of a second electrode arrangement according to a second aspect of the present invention.

Referring now to FIGS. 2 and 3 which illustrate in more detail the electrodes mentioned briefly above, it will be appreciated that they may comprise a number of different shapes but that each employs the same basic principle of operation.

Referring to FIG. 2, it will be seen that the electrode material 50 is formed as a coil of filament wire and arranged so as to extend along a longitudinal axis X-X such that the open rings of the coil circle around said axis and create an interior zone 52, the function of which will be described later herein. Surrounding the electrode material coil 50 is a shield 54 formed from, for example, clear quartz and having a sidewall 56 provided with one or more holes 56a extending therethrough. Holes may be provided in the singular, in which case the position thereof is selected to suit the desired direction of plasma creation, or as a series of holes provided within the sidewall positioned to direct escaping plasma creating gas in a desired, collective, direction or into a general region surrounding the electrode 22, 24. FIG. 2 shows a series of holes for creating a plasma zone generally around the electrode and within region R. The filament may be made of a number of materials, but is preferably a refractory metal such as tungsten, tantalum or molybdenum and, if provided as a tungsten element, may have a diameter of between 0.1 mm and 1.0 mm and preferably 0.2 mm, which has been found to be sufficient for general treatment purposes. The otherwise free end 56 of the electrode material 50 passes through an insulating block 58 and enters a base portion 60 of the electrode in which it is electrically coupled to a terminal 62. Terminal 62 is positioned on the outside of the base portion so as to allow for the connection thereof to the electrical supply 20 of FIG. 1. A gas supply pipe 64 is positioned for supplying gas from container 18, into the base portion 60 and, thence, into the region 66 between the electrode material 50 and shield 54 before being directed along the longitudinal axis X-X of the coil itself. The base portion 60 is further provided with a region 66 around which are provided a pair of seals 68 which act to seal any gap between the shield 54 and portion 66, whilst also retaining the shield on the base portion.

Figure 4:
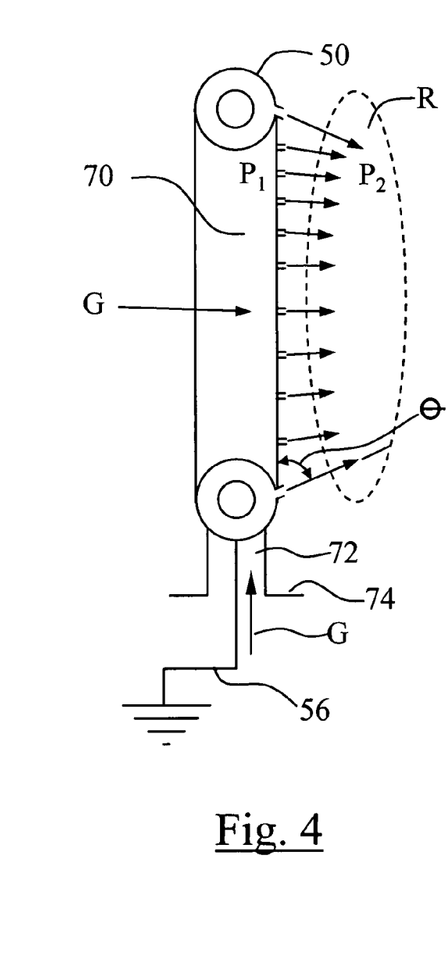
FIG. 4 is a further cross-sectional view of the second electrode taken in the direction of arrows A-A of FIG. 3.

FIGS. 3 and 4 illustrate a preferred alternative electrode arrangement in which the electrode material filament is formed as an open coil extending in an arc and preferably a complete or substantially complete circle having an inner hole 70. The shield 54 is similarly shaped as an arc, or preferably a complete circle, and surrounds the electrode material 54 in the manner described in relation to FIG. 1 above. Whilst it will be appreciated that the outlets 56a may be provided in any one of a number of positions within the sidewall 54, it has been found that providing the outlets on one side thereof and positioning the axis of the holes such that any plasma gas emitted therefrom is directed to converge with gas emitted from associated holes, one may create an intensified plasma zone in a region R adjacent the electrode itself. In a particularly desirable arrangement, the holes are positioned to direct the plasma gas from a circular electrode arrangement such as to converge in a cone-like manner, as shown. Such an arrangement helps intensify the created plasma and, when a circular arrangement is employed, creates a cone of plasma into which any processing gas G may be directed. In order to ensure an even emission of plasma gas from the electrode, it may prove desirable to vary the size and/or distance between the outlets such that there is a higher concentration of outlets the further one gets away from the source of plasma generating gas. Alternatively, one could simply vary the size of the holes, with larger diameters farther from the gas inlet. This forces electrons to flow through the entire electrode material and generate a magnetic field through the entire electrode (by entering farthest from the electrical inlet connection), in addition to forcing gas G through the entire electrode. In some arrangements it may be desirable to provide a single or a relatively small number of outlets at a point remote from the gas input point, thereby to ensure the plasma gas has a high residence time adjacent to the electrode material. Further features of FIGS. 3 and 4 include a gas/electrode feed portion 72 for allowing shielding gas to be introduced into the electrode and a mounting portion shown schematically at 74.

Figure 5:
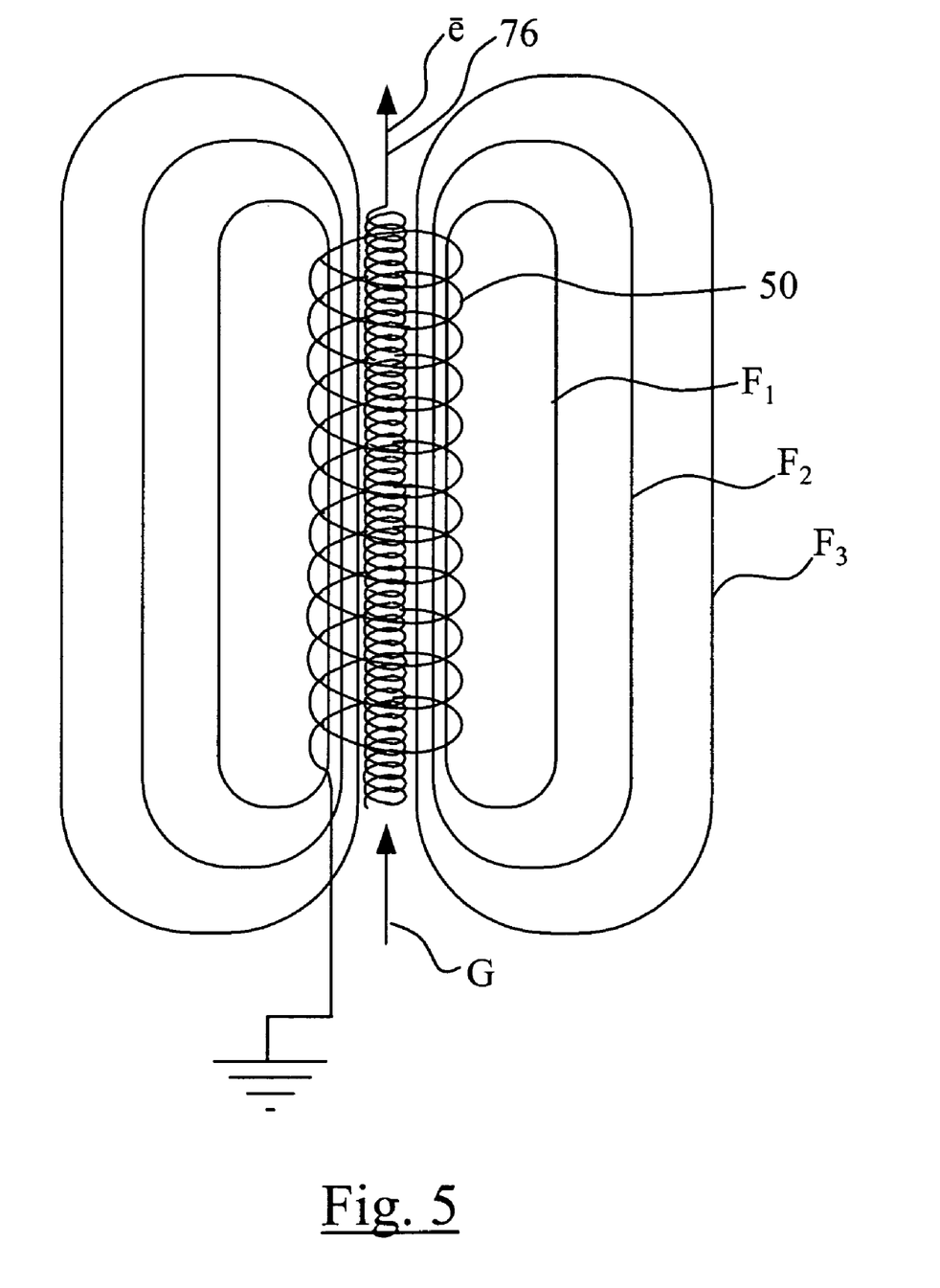
FIG. 5 is a diagrammatic representation of the magnetic fields and electron path within the above-mentioned arrangements.

The operation of the electrodes shown in FIGS. 2 to 4 is best illustrated with reference to FIG. 5 which shows an electrode material coil at 50 and a plurality of magnetic field lines F1, F2 and F3 created as a direct result of passing a current through the coil arrangement 50. An inert plasma creating gas is introduced at 72 and directed substantially along the longitudinal axis of the electrode material and preferably within the coils themselves.

The current is selected to be sufficient to heat the electrode material 50 to thermionic temperature and allow for the release of electrons from the surface thereof. Once an electron has been released, it is desirable to retain it within the confines of the magnetic field for as long as possible so as to allow it to acquire a high energy level and to allow it to collide with more neutral gas atoms, which creates more ionization. Path 76 illustrates the flight of the electron and its confinement within the magnetic fields. The electron will gyrate along the magnetic field lines following the equation $F=qv \times B$, where q=electron charge, v=electron velocity and B=magnetic field. Once the electron has passed along the length of the coil in FIG. 2, it will be released from the confines of the magnetic field and allowed to be emitted from the electrode. The plasma generating gas is directed along the axis of a coiled electrode material, thereby to ensure the gas is maintained in contact with the electrode material as long as possible and any emitted electrons are confined for as long as possible and thereby concentrated before being released in a particular, controlled, direction. In the arrangement of FIG. 2, the electrons are constrained to pass around the circular electrode material arrangement in a "race track" type manner, thereby still further concentrating the electrons before release from the confines of the magnetic field. This is because the field lines meet in a circle and the electrons will tend to follow the circular field lines, particularly at lower pressures. The magnetic field intensity can also be increase, by increasing the number of turns in the coil, following the formula: $B=\rho NI/L$, where $\rho$=permeability, N=number of turns, I=current and L=length. Additionally, when using an AC or DC bipolar pulse, the counter electrode may be given a negative bias with respect to the workpiece, for some limited portion of the waveform. This will also have the effect of increasing the plasma density around the counter electrode, because of the higher bias that occurs between a plasma and a negatively biased electrode compared to a positively biased electrode (as plasma potential will tend to rise to a few eV higher than the most positive electrode potential). This higher bias will result in increased ion bombardment, resulting in increased heating and thermionic emission of electrons. These electrons will then be contained by the magnetic field and will then collide with gas neutrals increasing the plasma density. This increased plasma density will then be available, before decaying, when the positive portion of the waveform is applied to the counter electrode.

Various treatment steps will now be described by way of example only in order to help the reader understand the possible uses to which the above-mentioned apparatus may be put. It will be appreciated that the above-described apparatus and electrode of FIGS. 1 to 5 may be employed in any one or more of the following steps and their use is not confined to the use in a process adopting all of the following steps. In a first example, a pre-cleaning step may be employed and facilitated by the introduction of a sputtering gas, such as argon, from the first gas supply container 18. The pre-cleaning may be initiated after pump down to $1\times10^{-3}$ Torr or preferentially below $1\times10^{-4}$ Torr. Contaminants on the interior surface of the workpiece are sputtered off when a negative DC pulse is applied via the power supply 20.

An optional implantation step for nitriding or carbon implantation may be used in some applications. Carbon implantation, for example, forms a subsurface carbon layer in the workpiece material, which may be stainless steel. This layer improves the adhesion to any subsequently deposited layer and other materials. Carbon implantation is provided at a higher magnitude bias than experienced in the other steps of the coating process. A suitable bias is one which exceeds 5 kV. Care must be taken at this step for small diameter tubes, so that the size of the plasma sheath does not become larger than the radius of the workpiece.

A precursor deposition step may be employed in which one precursor is introduced into the workpiece 10. Acceptable precursors include methane, acetylene or toluene. The DC pulsed voltage is reduced in this process step in order to provide thin film deposition, rather than implantation. During the coating step, argon may be mixed with the carbon-containing precursors, so as to provide increased ion bombardment, and/or lower the impedance of the plasma. The coating parameters may be dynamically adjusted during the coating process in order to produce a desired combination coating. The probes provide information that can be used by the computer software control 42 and the pressure controller 34 to maintain various parameters within their ranges of tolerance. Thus, the factors which determine pressure within the workpiece can be adjusted as needed or the magnitude and duty cycle of the pulsed bias may be adjusted, if necessary.

What is claimed is:

1. An electrode for a deposition process comprising:
   an electrode material;
   a gas inlet positioned relative to said electrode material for directing a shielding gas over an outer surface of said electrode material; and
   a base, said base including a gas inlet opening and one or more gas outlet openings positioned for directing gas towards and around said electrode material;
   wherein the electrode material comprises a metal coil having a longitudinal central axis and wherein said gas inlet is positioned for releasing said gas so as to flow within said metal coil substantially along said axis.

2. An electrode as claimed in claim 1 further comprising a shield encasing said electrode material, said shield including a surface and an outlet within said surface through which, in operation, said shielding gas may pass.

3. An electrode as claimed in claim 1 further comprising a shield encasing said electrode material, said shield including a surface and an outlet and in which said shield comprises a tube having a sidewall, said sidewalls having a plurality of outlets.

4. An electrode as claimed in claim 1 further comprising a shield encasing said electrode material, said shield including a surface and an outlet and in which said axis comprises an arc.

5. An electrode as claimed in claim 1 further comprising a shield encasing said electrode material, said shield including a surface and an outlet and in which said axis extends through a complete circle.

6. An electrode as claimed in claim 1 further comprising a shield encasing said electrode material, said shield including a surface and an outlet and in which said shield has a plurality of said outlets and wherein the distance between said outlets reduces as the distance from the gas inlet increases.

7. An electrode as claimed in claim 1 further comprising a shield encasing said electrode material, said shield including a surface and a plurality of outlets, in which the diameter of said outlets increases as the distance from the gas inlet increases.

8. An electrode as claimed in claim 1 further comprising a shield encasing said electrode material, said shield including a surface and a plurality of outlets and in which the outlets include central axes and said axes converge.

9. An electrode as claimed in claim 1 wherein said electrode material comprises a refractory metal.

10. An electrode as claimed in claim 1 wherein said electrode material is selected from a list comprising:
    tantalum, tungsten and/or molybdenum.

11. An electrode as claimed in claim 1 further comprising a shield encasing said electrode material and having a plurality of outlets along the length of said shield and around the circumference thereof.

12. An electrode as claimed in claim 1 further comprising a shield encasing said electrode material and having an outlet at a point remote from the gas inlet, thereby to cause gas to pass along said electrode material before exiting from said shield.

13. An electrode as claimed in claim 1 further comprising a non-metallic shield encasing said electrode material.

14. An electrode as claimed in claim 1 further comprising a shield of transparent material.

15. An electrode as claimed in claim 1 further comprising a shield of quartz.

16. An electrode as claimed in claim 1 wherein said base includes a plenum chamber between said inlet opening and said one or more outlet openings.

17. An electrode as claimed in claim 1 wherein said base includes an external coupling for coupling to an aperture in a wall of a processing chamber.

18. An electrode as claimed in claim 1 wherein said coil comprises an open coil.

19. An electrode as claimed in claim 1 wherein said coil comprises an end portion for electrical connection to a mounting portion.

20. An electrode as claimed in claim 1 further comprising an electrode mounting portion wherein said mounting portion is within said base and has an external electrical connector for connection to an external supply of electricity.

21. An electrode as claimed in claim 1 wherein said electrode material comprises a tungsten filament.

22. An electrode as claimed in claim 21 wherein said filament comprises a tungsten filament of 0.2 mm diameter.

23. An electrode as claimed in claim 1 further comprising a source of pulsed electrical supply for supplying a pulsed current to said electrode.

24. An electrode for a deposition process comprising:
    an electrode material;
    a gas inlet positioned relative to said electrode material for directing a shielding gas over an outer surface of said electrode material; and
    a shield encasing said electrode material, said shield including a surface and an outlet and in which said shield comprises a tube having a sidewall, said sidewall having a plurality of outlets;
    wherein the electrode material comprises a metal coil having a longitudinal central axis and wherein said gas inlet is positioned for releasing said gas so as to flow within said metal coil substantially along said axis.

25. An electrode for a deposition process comprising:
    an electrode material;

a gas inlet positioned relative to said electrode material for directing a shielding gas over an outer surface of said electrode material; and a base portion and a shield around said electrode material, wherein a seal is between said base portion and said shield;

wherein the electrode material comprises a metal coil having a longitudinal central axis and wherein said gas inlet is positioned for releasing said gas so as to flow within said metal coil substantially along said axis.

26. An electrode for a deposition process in which deposition is from a treatment gas comprising:

an electrode material;

a gas inlet positioned relative to said electrode material for directing a shielding gas over an outer surface of said electrode material; and a non-metallic shield encasing said electrode material to shield said electrode material from exposure to said treatment gas, said shield including a sidewall having at least one outlet;

wherein the electrode material comprises a metal coil having a longitudinal central axis and wherein said gas inlet is positioned for releasing said shielding gas so as to flow within said metal coil substantially along said axis.

* * * * *